United States Patent
Kuwata et al.

(10) Patent No.: US 9,647,615 B2
(45) Date of Patent: May 9, 2017

(54) BROADBAND AMPLIFIER

(71) Applicant: Mitsubishi Electric Corporation, Tokyo (JP)

(72) Inventors: Eigo Kuwata, Tokyo (JP); Koji Yamanaka, Tokyo (JP); Hiroshi Otsuka, Tokyo (JP); Tasuku Kirikoshi, Tokyo (JP); Yoshitaka Kamo, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 0 days.

(21) Appl. No.: 14/430,417

(22) PCT Filed: Nov. 26, 2013

(86) PCT No.: PCT/JP2013/081794
§ 371 (c)(1),
(2) Date: Mar. 23, 2015

(87) PCT Pub. No.: WO2014/087886
PCT Pub. Date: Jun. 12, 2014

(65) Prior Publication Data
US 2015/0229283 A1  Aug. 13, 2015

(30) Foreign Application Priority Data
Dec. 3, 2012  (JP) ................. 2012-264354

(51) Int. Cl.
H03F 3/191 (2006.01)
H03F 1/56 (2006.01)
(Continued)

(52) U.S. Cl.
CPC .............. H03F 1/565 (2013.01); H03F 1/42 (2013.01); H03F 1/56 (2013.01); H03F 3/04 (2013.01);
(Continued)

(58) Field of Classification Search
CPC ... H03F 1/42; H03F 1/565; H03F 3/04; H03F 3/601; H03F 2200/222; H03F 1/56;
(Continued)

(56) References Cited

U.S. PATENT DOCUMENTS 5,111,157 A * 5/1992 Komiak ................. H03F 3/604
330/286
6,734,728 B1 * 5/2004 Leighton ................ H01L 23/66
257/401
(Continued)

FOREIGN PATENT DOCUMENTS

JP  2001-156242 A  6/2001
JP  2001-244710 A  9/2001
(Continued)

OTHER PUBLICATIONS

International Search Report; PCT/JP2013/081794; Mar. 4, 2014.
(Continued)

Primary Examiner — Khanh V Nguyen
(74) Attorney, Agent, or Firm — Studebaker & Brackett PC

(57) ABSTRACT

Parallel capacitors (5c and 5d) of impedance matching circuits (5) which are connected to two transistors (1), respectively, have their first ends connected to a ground through via holes (5e and 5f) that are used in common, respectively. Although a conventional circuit necessitates via holes by the number equal to the number of stages multiplied by the number of cells of the transistors (1) for an LPF type impedance matching circuit (3), the present circuit can halve the number of via holes of the LPF type impedance matching circuit (5), thereby being able to downsize the circuit.

12 Claims, 11 Drawing Sheets

(51) Int. Cl.
*H03F 1/42* (2006.01)
*H03F 3/60* (2006.01)
*H03F 3/04* (2006.01)

(52) U.S. Cl.
CPC ............ *H03F 3/601* (2013.01); *H03F 3/602* (2013.01); *H03F 3/191* (2013.01); *H03F 2200/222* (2013.01); *H03F 2200/318* (2013.01)

(58) Field of Classification Search
CPC . H03F 3/68; H03F 3/211; H03F 3/605; H03F 3/191
USPC .............................. 330/124 R, 250, 295, 302
See application file for complete search history.

(56) References Cited

U.S. PATENT DOCUMENTS

| | | | | |
|---|---|---|---|---|
| 7,158,386 | B2 * | 1/2007 | Shih | .......................... H03F 1/30 330/295 |
| 7,692,493 | B1 * | 4/2010 | Chen | ..................... H03F 1/0261 330/117 |
| 2004/0222848 | A1 * | 11/2004 | Shih | .......................... H03F 1/30 330/66 |
| 2007/0024371 | A1 * | 2/2007 | Gotou | ..................... H03F 3/193 330/295 |
| 2009/0237166 | A1 | 9/2009 | Gotou et al. | |

FOREIGN PATENT DOCUMENTS

| | | |
|---|---|---|
| JP | 2001-320170 A | 11/2001 |
| JP | 2008-244763 A | 10/2008 |

OTHER PUBLICATIONS

G. Mouginot et al.; Three Stage 6-18 GHz High Gain and High Power Amplifier based on GaN Technology; 2010 IEEE MTT Symposium; pp. 1392-1395; May 2010.

The extended European search report issued by the European Patent Office on Jan. 9, 2017, which corresponds to European Patent Application No. 13860750.2-1805 and is related to U.S. Appl. No. 14/430,417; 9pp.

* cited by examiner

BROADBAND AMPLIFIER

TECHNICAL FIELD

The present invention relates to a broadband amplifier.

BACKGROUND ART

FIG. 16 is a circuit diagram showing a configuration of a conventional broadband amplifier.

In FIG. 16, a conventional broadband amplifier comprises a plurality of transistors 1, and stabilization circuits 2 and impedance matching circuits 3 which are connected to the gate terminals of the individual transistors 1, respectively.

The conventional broadband amplifier achieves broadband stabilization by connecting the stabilization circuits 2 to the transistors 1, and achieves broadband impedance matching by connecting the impedance matching circuits 3 in parallel with the stabilization circuits 2.

Incidentally, as a document relevant to the conventional technology, there is the following non-patent document 1.

PRIOR ART DOCUMENT

Non-Patent Document

Non-Patent Document 1: G. Mouginot et al., "Three Stage 6-18 GHz High Gain and High Power Amplifier based on GaN Technology", 2010 IEEE MTT Symposium, pp. 1392-1395, May, 2010.

DISCLOSURE OF THE INVENTION

Problems to be Solved by the Invention

With the foregoing configuration, the conventional broadband amplifier has a problem of increasing its circuit scale because the stabilization circuit 2 and impedance matching circuit 3 are disposed in parallel with each transistor 1.

The present invention is implemented to solve the foregoing problems. Therefore it is an object of the present invention to provide a broadband amplifier capable of downsizing the circuit.

Means for Solving the Problem

A broadband amplifier in accordance with the present invention comprises: a plurality of transistors; and impedance matching circuits that include parallel capacitors and via holes for connecting first ends of the parallel capacitors to a lower potential electrode, and that are connected to input terminals of the transistors via transmission lines, respectively, wherein the via holes of the impedance matching circuits that are connected to any two of the transistors are used in common.

Advantages of the Invention

According to the present invention, the via holes are used in common which connect ends of the parallel capacitors of the impedance matching circuits that are connected to the two transistors, respectively, to the lower potential electrode. Accordingly, it offers an advantage of being able to downsize the circuit. In addition, connecting ends of the capacitors that are connected to the two transistors, respectively, enables equalizing the potentials of the two transistors, thereby being able to regulate its operation and to prevent oscillation or the like.

BEST MODE FOR CARRYING OUT THE INVENTION

The best mode for carrying out the invention will now be described with reference to the accompanying drawings to explain the present invention in more detail.

Embodiment 1

Figure 1:
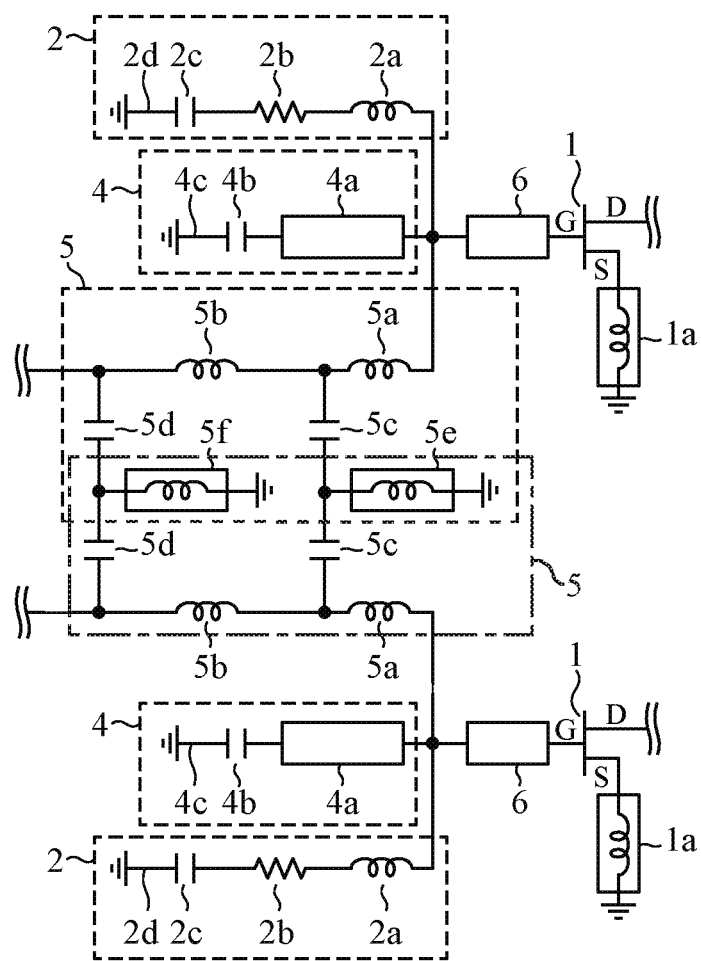
FIG. 1 is a circuit diagram showing a configuration of a broadband amplifier of an embodiment 1 in accordance with the present invention.

FIG. 1 is a circuit diagram showing a configuration of a broadband amplifier of an embodiment 1 in accordance with the present invention.

In FIG. 1, the broadband amplifier of the present embodiment 1 comprises transistors 1 consisting of a plurality of FETs (Field Effect Transistors); stabilization circuits 2, short stubs 4 and impedance matching circuits 5, which are connected to the gate terminals (input terminals) of the transistors 1 via transmission lines 6, respectively.

Each transistor 1 has its source terminal connected to a ground (lower potential electrode) through a via hole 1a.

Each stabilization circuit 2 comprises an inductor 2a, a resistance 2b, a capacitor 2c, and a via hole 2d that connects an end of the capacitor 2c to the ground.

Each short stub 4 comprises an inductor 4a, a capacitor 4b, and a via hole 4c that connects an end of the capacitor 4b to the ground.

Each impedance matching circuit 5 comprises an inductor 5a, a parallel capacitor 5c, and a via hole 5e that connects an end of the parallel capacitor 5c to the ground, and the via hole 5e is used in common.

In addition, it comprises an inductor 5b, a parallel capacitor 5d, and a via hole 5f that connects an end of the parallel capacitor 5d to the ground, and the via hole 5f is used in common.

Thus, in the impedance matching circuits 5, the inductors, parallel capacitors, and via holes are configured in a multi-stage fashion, and the via holes are each used in common between the two transistors 1.

The transmission line 6 are made shorter than $\lambda/4$ ($\lambda$: wavelength) of the operating frequency.

Supposing parameters of actual transistors 1, that the present embodiment 1 achieves the effect will be described.

Figure 2:
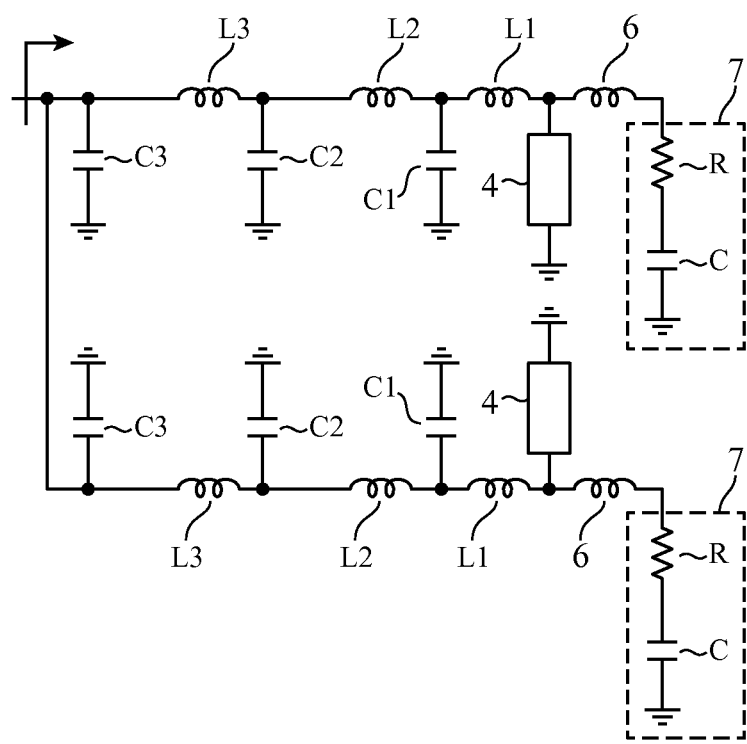
FIG. 2 is an equivalent circuit showing a broadband amplifier when not sharing via holes and not considering the inductances of the via holes.

FIG. 2 is an equivalent circuit when the via holes of the impedance matching circuits 5 are not used in common and the inductances of the via holes are not considered, and when the number of cells of the transistors 1 is two in FIG. 1.

It is assumed that the impedances in the state of adding the stabilization circuits 2 to the transistors 1 are represented by series circuits 7 of R (5Ω) and C (2 pF), respectively.

By assuming that the transmission lines 6 are sufficiently thin and hence can be approximated to an inductor, and by setting the inductance of the transmission lines 6 at 123 pH, the reactance at the center frequency is made zero.

Furthermore, using the short stubs 4 with the characteristic impedance of 2.5Ω and with a $\lambda/4$ wavelength at the center frequency enables impedance transformation of a high-frequency range in an inductive region to a capacitive region, and of a low-frequency range in the capacitive region to the inductive region.

Furthermore, the broadband impedance matching is achieved by performing impedance transformation to 50Ω through a Chebyshev three-stage LPF using inductances (L1-L3) and capacitances (C1-C3).

Figure 3:
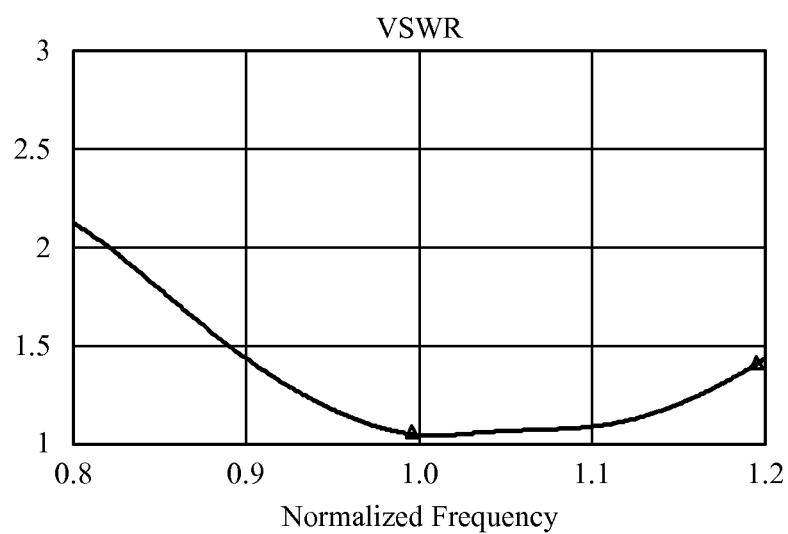
FIG. 3 is a frequency characteristic diagram showing a voltage standing-wave ratio (VSWR) of FIG. 2.

FIG. 3 shows frequency characteristics of VSWRs (voltage standing-wave ratios) of the amplifier when setting the parameters of the LPF at L1=93.1 pH, C1=1.572 pF, L2=302 pH, C2=0.604 pF, L3=786 pH, and C3=0.186 pF beginning from the components closer to the transistors.

The calculations of FIG. 3 show that satisfactory impedance matching is achieved which gives VSWRs of less than 1.5 in a broadband of normalized frequency 0.89-1.2.

Figure 4:
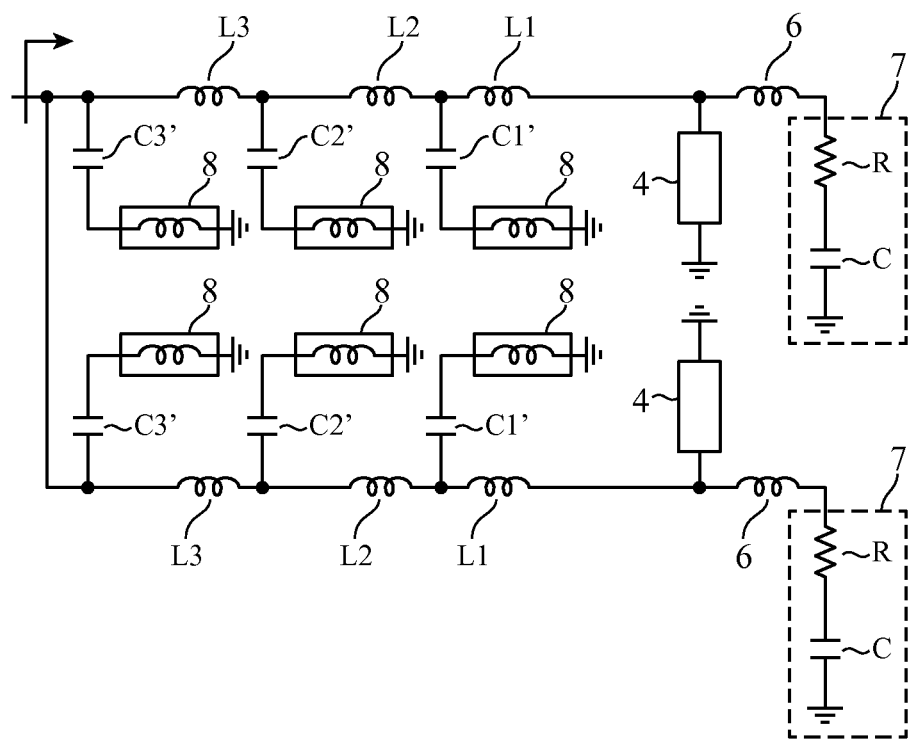
FIG. 4 is an equivalent circuit showing a broadband amplifier when not sharing via holes and when the inductances of the via holes are 50 pH.

FIG. 4 is an equivalent circuit of FIG. 1 when the via holes of the impedance matching circuits 5 are not used in common and the inductances of the via holes 8 are set at 50 pH, and when the number of cells of the transistors 1 is two.

To equalize the reactance of each capacitor and the reactance of the capacitor +50 pH, the value of the capacitor is modified according to the following Expression (1).

Incidentally, it is assumed in the following Expression (1) that the original capacitance is C, the capacitance after the modification is C', the inductance of the via holes is L, and the center angular frequency is $\omega$.

$$C' = \frac{C}{1 + \omega^2 LC} \quad (1)$$

Using the foregoing Expression (1), the capacitances after the transformation are C1'=1.2 pF, C2'=0.54 pF, and C3'=0.179 pF.

Figure 5:
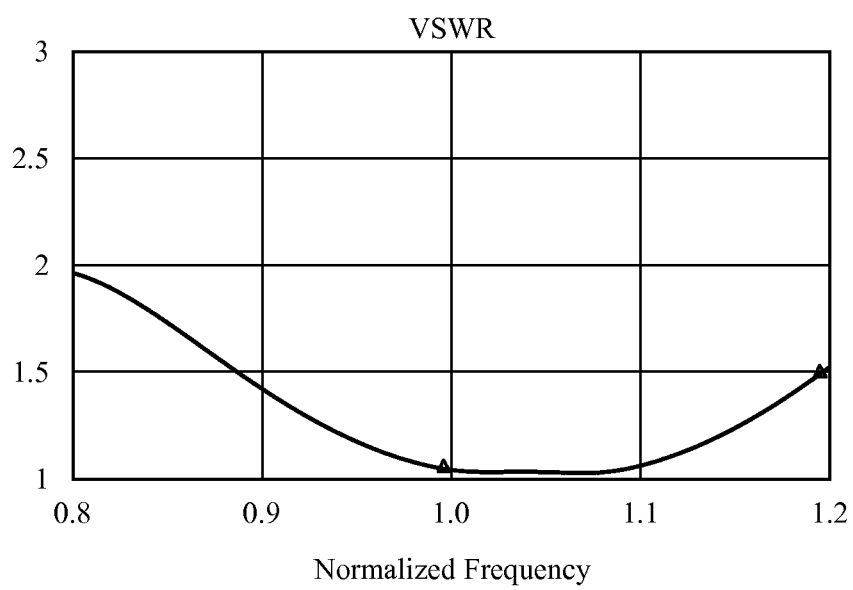
FIG. 5 is a frequency characteristic diagram showing a voltage standing-wave ratio (VSWR) of FIG. 4.

FIG. 5 shows frequency characteristics of VSWRs of the amplifier when considering the inductance of the via holes using these values.

As in FIG. 3, the calculations in FIG. 5 show that satisfactory impedance matching is achieved which gives VSWRs of less than 1.5 in a broadband of normalized frequency 0.89-1.2.

Figure 6:
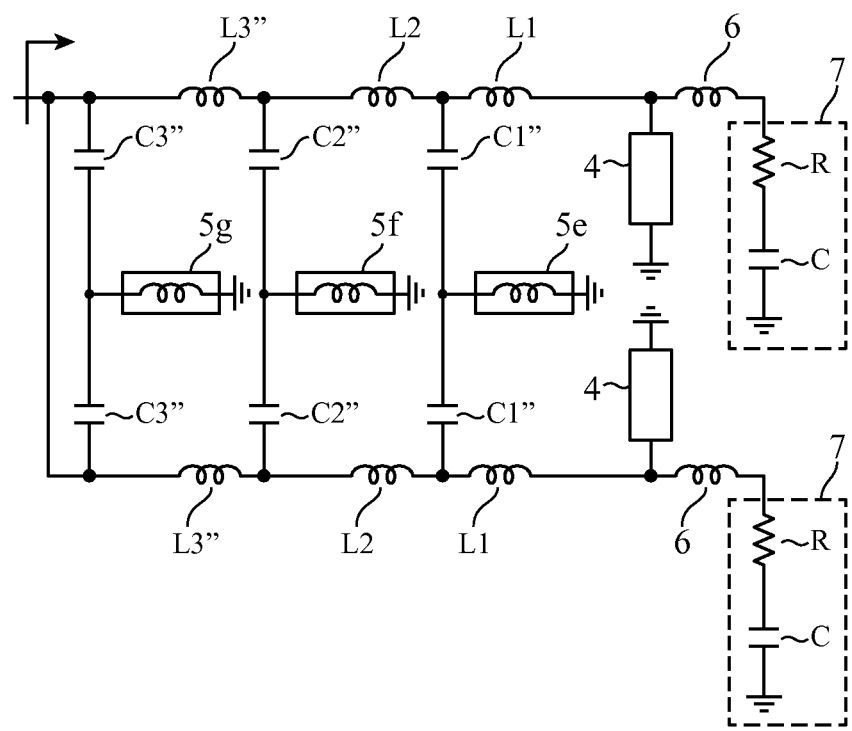
FIG. 6 is an equivalent circuit showing a broadband amplifier when sharing via holes and when the inductances of the via holes are 50 pH.

FIG. 6 is an equivalent circuit when the via holes of the impedance matching circuits 5 are used in common and the inductances of the via holes 5e, 5f and 5g are set at 50 pH, and when the number of cells of the transistors 1 is two as in FIG. 1.

Using the foregoing Expression (1) in the same manner to correct the capacitances gives the calculations of C1'=0.97 pF, C2"=0.488 pF, and C3"=0.158 pF.

Furthermore, fine adjustment of the value of L3" is made to 0.7 pH.

Figure 7:
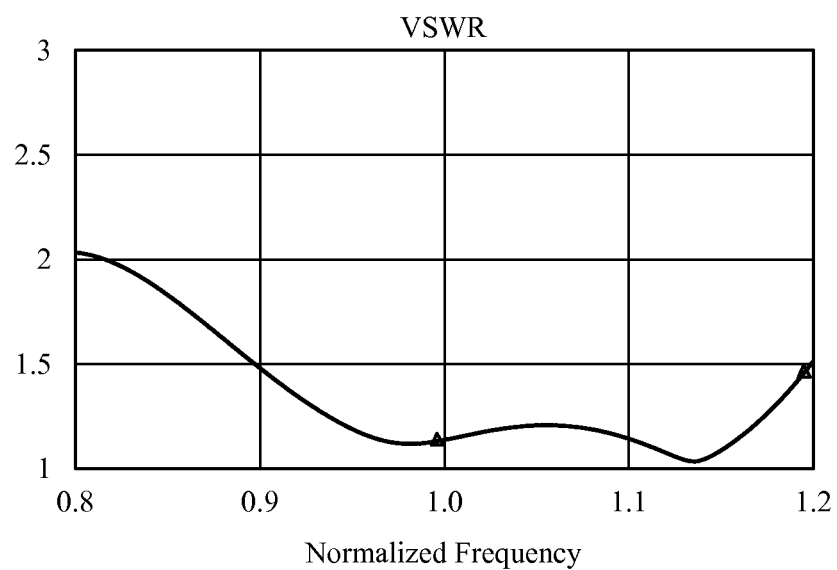
FIG. 7 is a frequency characteristic diagram showing a voltage standing-wave ratio (VSWR) of FIG. 6.

FIG. 7 shows frequency characteristics of VSWRs of the amplifier when considering the inductance of the via holes using these values.

As in FIG. 3 and FIG. 5, the calculations in FIG. 7 show that satisfactory impedance matching is achieved which gives VSWRs of less than 1.5 in the broadband of normalized frequency 0.89-1.2.

In addition, the difference between the impedances due to the variation of the transistors between the circuit of the present embodiment 1 and the conventional circuit will be described.

Figure 8:
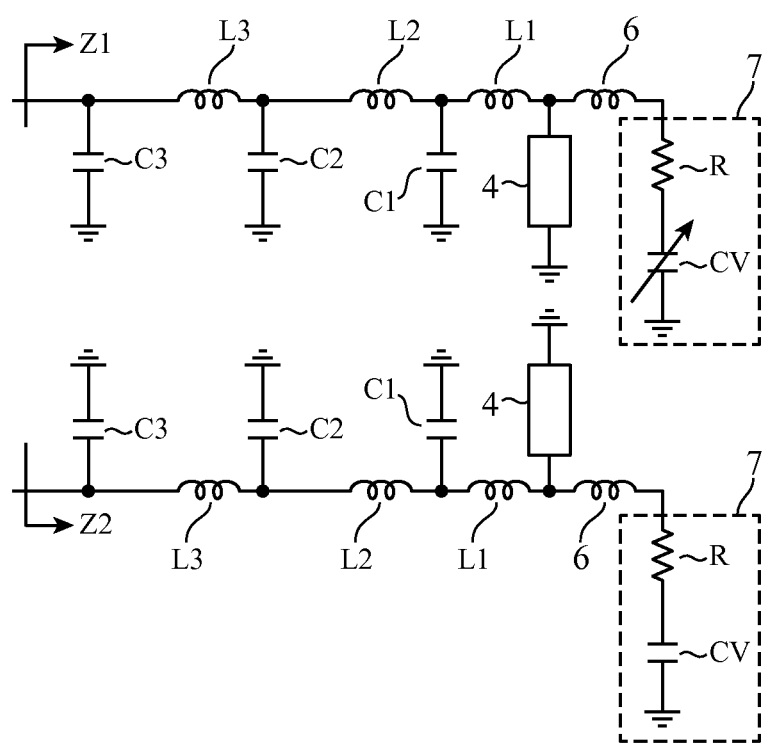
FIG. 8 is an equivalent circuit showing a broadband amplifier for computing the amount of difference (Diff) between impedances corresponding to FIG. 2.
Figure 9:
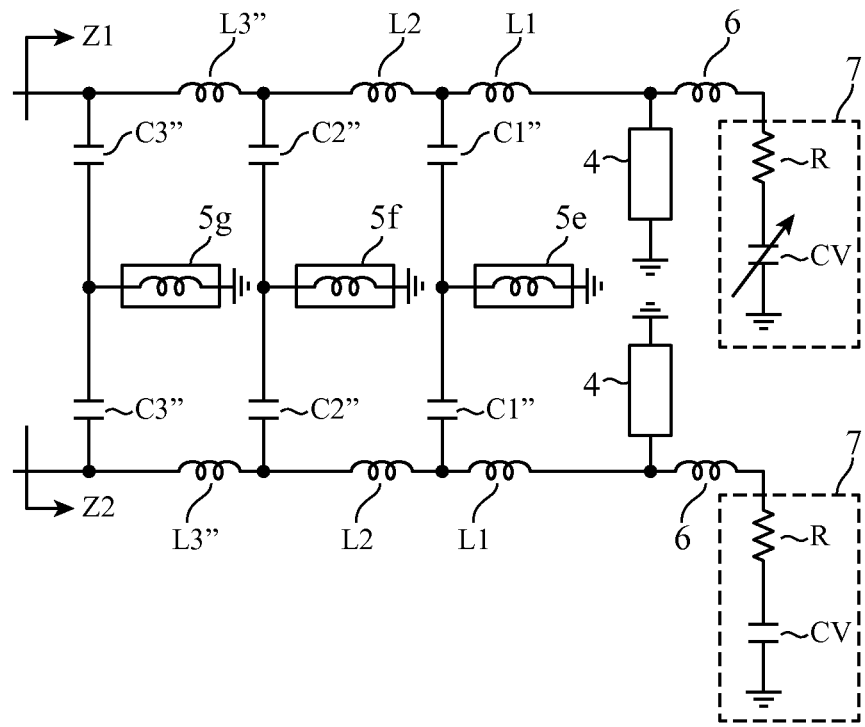
FIG. 9 is an equivalent circuit showing a broadband amplifier for computing the amount of difference (Diff) between impedances corresponding to FIG. 6.

As for a circuit diagram with which the computation is made, FIG. 8 shows a circuit diagram corresponding to FIG. 2, and FIG. 9 shows a circuit diagram of the present embodiment 1 corresponding to FIG. 6.

In each diagram of FIG. 8 and FIG. 9, the difference between the impedances Z1 and Z2 is compared.

As the Expression for obtaining the reference to be compared, the following Expression (2) is used.

Here, Z2 denotes the conjugate complex number of Z2.

$$\mathit{Diff} = \frac{Z1 - Z2}{Z1 + \overline{Z2}} \quad (2)$$

Figure 10:
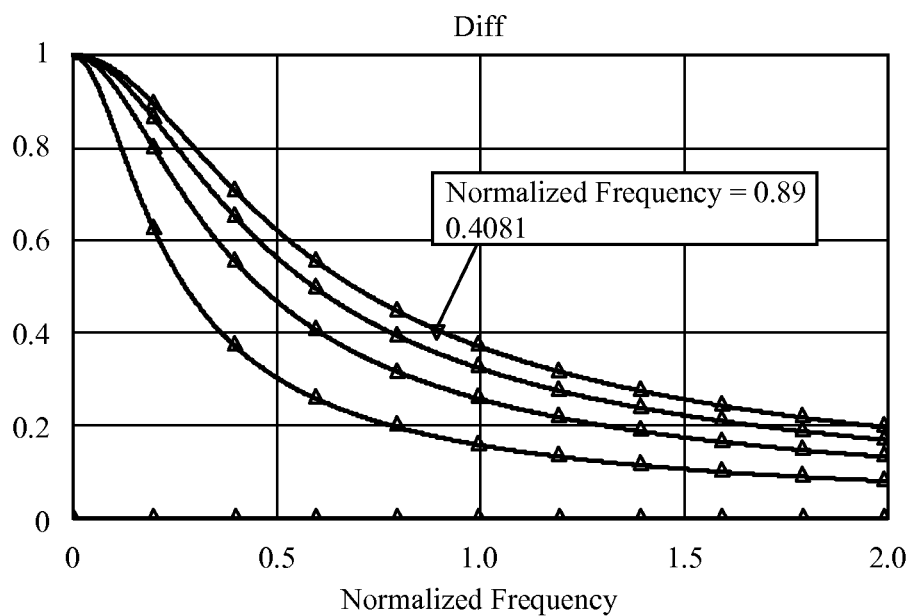
FIG. 10 is a frequency characteristic diagram showing the amount of difference (Diff) between impedances of FIG. 8.
Figure 11:
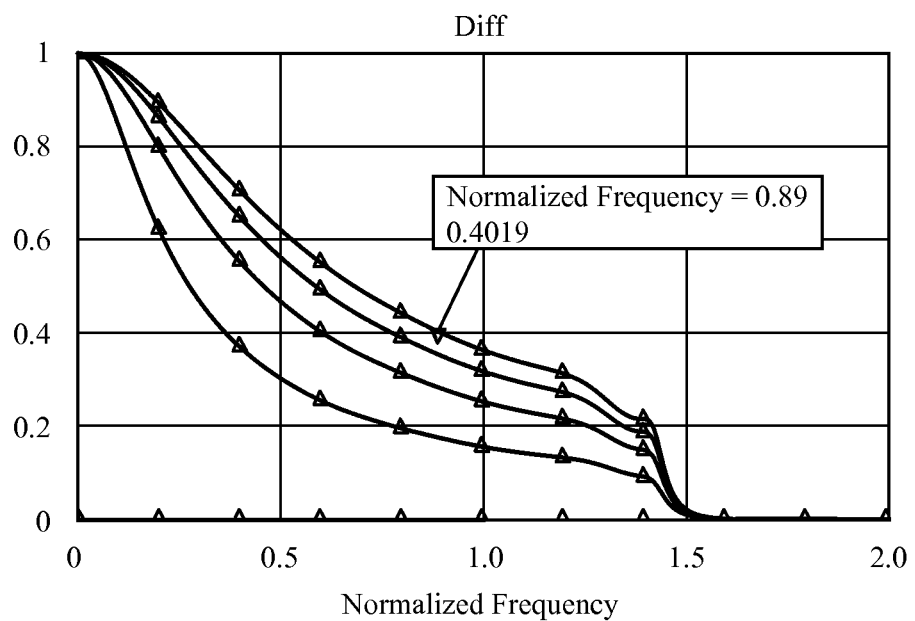
FIG. 11 is a frequency characteristic diagram showing the amount of difference (Diff) between impedances of FIG. 9.

FIG. 10 and FIG. 11 show the calculations of Diff (amounts of differences) when varying the value of the capacitor CV of the series circuit 7 in the stabilization circuit 2 at every 0.5 pF step from 2 pF to 4 pF in FIG. 8 and FIG. 9.

Incidentally, in FIG. 10 and FIG. 11, from the bottom to the top of the four lines, the value of the capacitor CV varies from 2 pF to 4 pF.

As shown in FIG. 10 and FIG. 11, the amount of difference, which is about 0.41 in the circuit diagram of FIG. 8 corresponding to FIG. 2, can be reduce to about 0.4 in the circuit diagram of FIG. 9 corresponding to the present embodiment 1.

As described above, according to the present embodiment 1, the via hole 5e or 5f that connects to the ground the ends of the parallel capacitors 5c or 5d of the impedance matching circuits 5 connected to the two transistors 1, respectively, is used in common.

Accordingly, although the LPF type impedance matching circuits 3 in the conventional circuit require the via holes by the number equal to the number of stages multiplied by the number of cells of the transistors 1, the circuit of the present embodiment 1 can halve the number of via holes of the LPF type impedance matching circuits 5, thereby being able to downsize the circuit.

In addition, downsizing the substrate or IC enables downsizing of a system that requires the high frequency circuit.

In addition, the present embodiment 1 is configured to set the inductors of the stabilization circuits 2, short stubs 4 and impedance matching circuits 5 and the inductances of the via holes, and the capacitances of the parallel capacitors at optimum values.

Accordingly, while carrying out the broadband impedance matching, it can reduce the amount of difference between the impedances due to the variation of the transistors 1 as compared with the conventional circuit.

The reduction of the amount of difference between the impedances due to the variation of the transistors 1 enables suppressing the variation of the amplification performance and parasitic oscillation like loop oscillation. Incidentally, as for the oscillation suppression, loading a resistance (referred to as an isolation resistance) between the circuit corresponding to the transistor 1 and the circuit corresponding to the transistor 2 can achieve a higher oscillation suppression effect.

Embodiment 2

Figure 12:
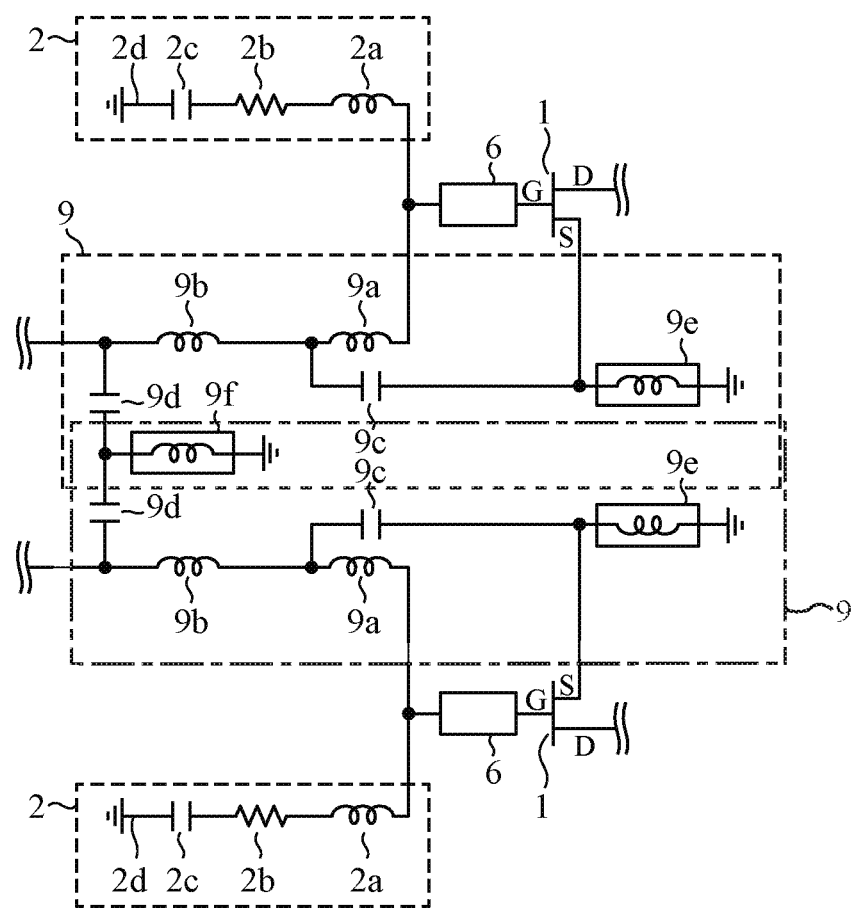
FIG. 12 is a circuit diagram showing a configuration of a broadband amplifier of an embodiment 2 in accordance with the present invention.

FIG. 12 is a circuit diagram showing a configuration of a broadband amplifier of an embodiment 2 in accordance with the present invention.

In FIG. 12, the broadband amplifier of the present embodiment 2 comprises a plurality of transistors 1; and stabilization circuits 2 and impedance matching circuits 9, which are connected to the gate terminals of the transistors 1 via transmission lines 6, respectively.

Thus, the present embodiment 2 does not comprise the short stubs 4 shown in the previous embodiment 1.

Each impedance matching circuit 9 comprises an inductor 9a, a parallel capacitor 9c, and a via hole 9e that connects an end of the parallel capacitor 9c to the ground, and the via hole 9e is used in common with the via hole 9e that connects the source terminal of the transistor 1 to the ground.

In addition, it comprises an inductor 9b, a parallel capacitor 9d, and a via hole 9f that connects an end of the parallel capacitor 9d to the ground, and the via hole 9f is used in common.

Thus, in the impedance matching circuits 9, the inductors, parallel capacitors, and via holes are configured in a multistage fashion, and the via holes 9e in the first stage are used in common with the via holes 9e that connect the source terminals of the transistors 1 to the ground, and the via holes in the second stage and on are used in common between the two transistors 1.

Supposing parameters of actual transistors 1, that the present embodiment 2 achieves the effect will be described.

Figure 13:
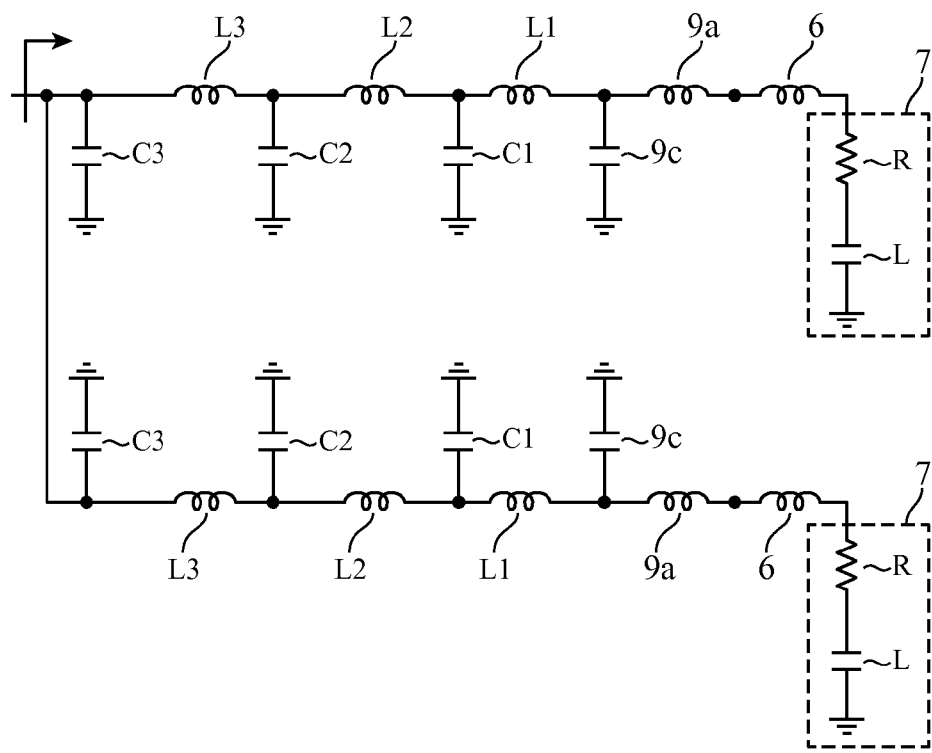
FIG. 13 is an equivalent circuit showing a broadband amplifier when not sharing via holes and not considering the inductances of the via holes.

FIG. 13 is an equivalent circuit when the via holes of the impedance matching circuits 9 are not used in common and the inductances of the via holes are not considered, and when the number of cells of the transistors 1 is two in FIG. 12.

It is assumed that the impedances in the state of adding the stabilization circuits 2 to the transistors 1 are represented by series circuits 7 of R (5Ω) and C (2 pF), respectively.

By assuming that the transmission lines 6 are sufficiently thin and hence can be approximated to an inductor and by setting the inductance of the transmission lines 6 at 123 pH, the reactance at the center frequency is made zero.

Furthermore, using the series inductor 8a (0.1 nH) and the parallel capacitor 8c (1.4 pF) enables impedance transformation of a high-frequency range in an inductive region to a capacitive region, and a low-frequency range in the capacitive region to the inductive region.

Furthermore, the broadband impedance matching is achieved by performing impedance transformation to 50Ω through a Chebyshev three-stage LPF using inductances (L1-L3) and capacitances (C1-C3).

Figure 14:
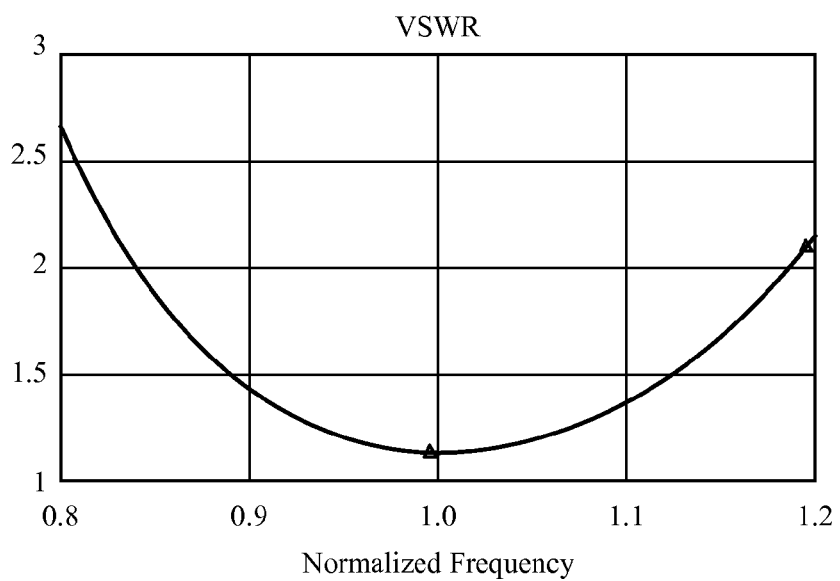
FIG. 14 is a frequency characteristic diagram showing a voltage standing-wave ratio (VSWR) of FIG. 13.

FIG. 14 shows frequency characteristics of VSWRs (voltage standing-wave ratios) of the amplifier when setting the parameters of the LPF at L1=181 pH, C1=0.654 pF, L2=420 pH, C2=0.345 pF, L3=794 pH, and C3=0.149 pF beginning from the components closer to the transistors.

The calculations of FIG. 14 show that satisfactory impedance matching is achieved which gives VSWRs of less than 1.5 in a broadband of normalized frequency 0.89-1.2.

Paying attention to FIG. 13 and FIG. 2, their difference is the short stub 4, and the inductor 9a and parallel capacitor 9c.

Since the via holes can also be used in common in the circuit of FIG. 13, it can reduce the amount of difference between the impedances due to the variation of the transistors 1 as compared with the conventional circuit, while carrying out the broadband impedance matching by the broadband amplifier of FIG. 12 as described in the explanation of the previous embodiment 1 with reference to FIG. 4 and on.

Reduction of the amount of difference between the impedances due to the variation of the transistors 1 enables suppressing the amplification performance variation and the parasitic oscillation like loop oscillation.

In addition, it uses the via hole 9f in common which connects the ends of the parallel capacitors 9d of the impedance matching circuits 9 that are connected to the two transistors 1 to the ground, respectively.

Furthermore, it uses the via hole 9e that connects the end of the parallel capacitor 9c to the ground in common with the via hole 9e that connects the source terminal of the transistor 1 to the ground.

Accordingly, although the LPF type impedance matching circuits 3 in the conventional circuit require the via holes by the number equal to the number of stages multiplied by the number of cells of the transistors 1, the circuit of the present embodiment 2 can halve the number of via holes of the LPF type impedance matching circuits 9, thereby being able to downsize the circuit.

In addition, downsizing the substrate or IC enables downsizing of a system that requires a high frequency circuit.

Figure 15:
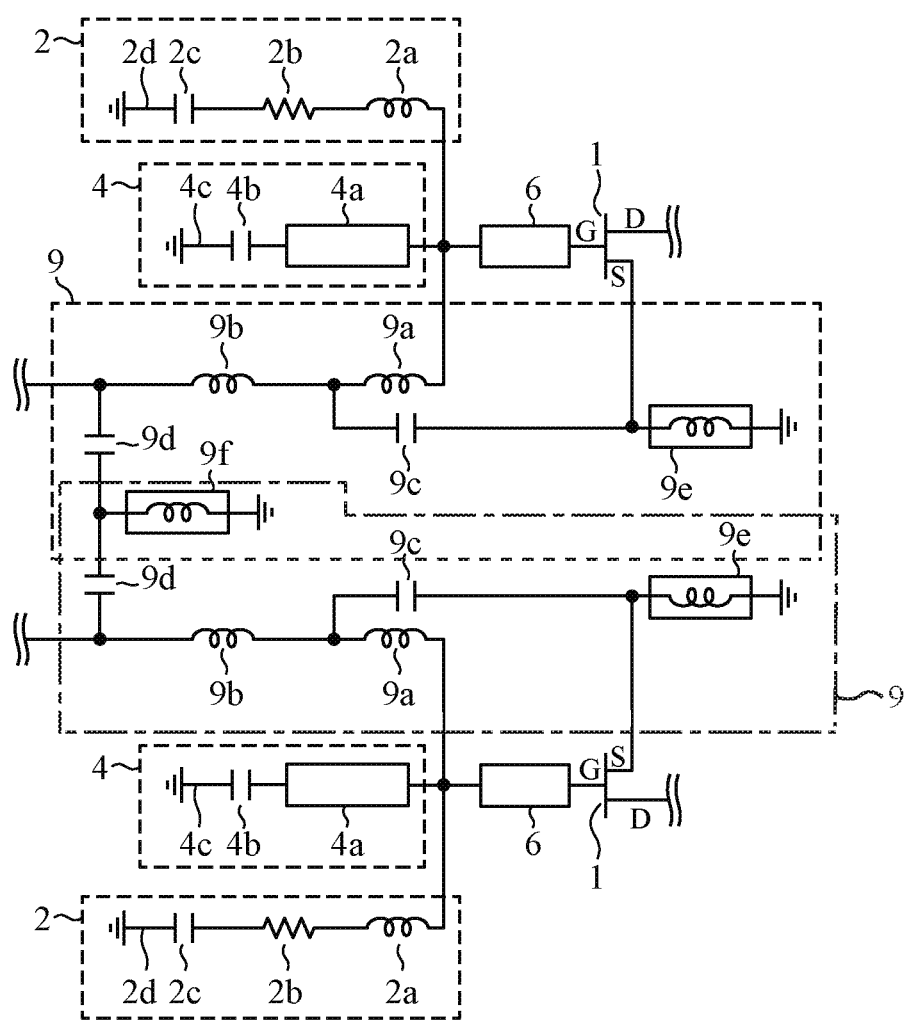
FIG. 15 is a circuit diagram showing another configuration of the broadband amplifier of the embodiment 2 in accordance with the present invention.
Figure 16:
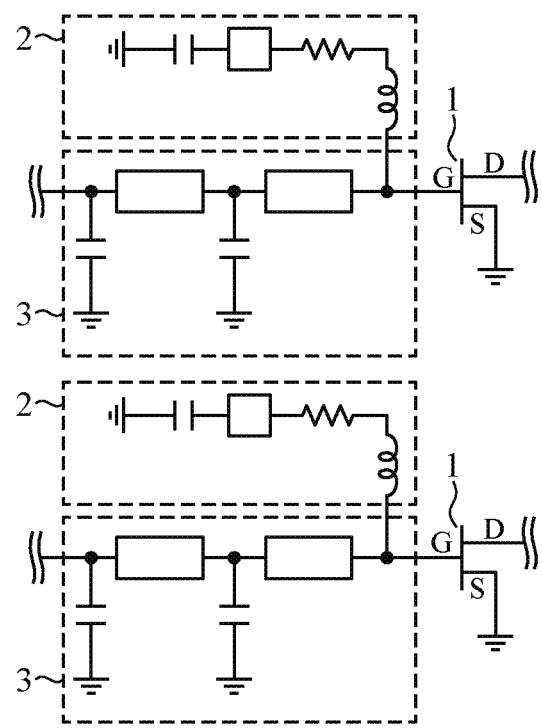
FIG. 16 is a circuit diagram showing a configuration of a conventional broadband amplifier.

FIG. 15 is a circuit diagram showing a configuration of another broadband amplifier of the embodiment 2 in accordance with the present invention.

The configuration of FIG. 15 has the short stubs 4 connected thereto, which are not connected in FIG. 12.

In this case also, the same advantages as those of the configuration shown in FIG. 12 can be obtained.

As described above, according to the present embodiment 2, it can offer the same advantages as the previous embodiment.

Incidentally, although the above-mentioned embodiments describe the examples that use FETs as the transistors 1, BJTs (Bipolar Junction Transistors) are also applicable to the transistors 1, offering the similar advantages.

In this case, the gate terminal, drain terminal and source terminal of an FET correspond to the base terminal, collector terminal and emitter terminal of a BJT.

Incidentally, it is to be understood that a free combination of the individual embodiments, variations of any components of the individual embodiments or removal of any components of the individual embodiments is possible within the scope of the present invention.

INDUSTRIAL APPLICABILITY

Since a broadband amplifier in accordance with the present invention uses the via holes of the impedance matching circuits connected to the two transistors in common, it can downsize the circuit. Accordingly, it is suitable for an application to a system that requires a high frequency circuit.

DESCRIPTION OF REFERENCE SYMBOLS 1 transistor; 1a, 2d, 4c, 5e, 5f, 5g, 8, 9e, 9f via hole; 2 stabilization circuit; 2a, 4a, 5a, 5b, 9a, 9b inductor; 2b resistance; 2c, 4b capacitor; 4 short stub; 5, 9 impedance matching circuit; 5c, 5d, 9c, 9d parallel capacitor; 6 transmission line; 7 series circuit.

What is claimed is:

1. A broadband amplifier comprising:
a plurality of transistors; and
impedance matching circuits that include parallel capacitors and via holes for connecting first ends of the parallel capacitors to a lower potential electrode, and that are connected to input terminals of the transistors via transmission lines, respectively, wherein
the via holes of the impedance matching circuits that are connected to any two of the transistors are used in common.

2. The broadband amplifier according to claim 1, wherein the impedance matching circuits are comprised of a multistage configuration including inductors in addition to the parallel capacitors and the via holes.

3. The broadband amplifier according to claim 1, further comprising stabilization circuits that are connected to the input terminals of the transistors via the transmission lines.

4. The broadband amplifier according to claim 1, further comprising short stubs that are connected to the input terminals of the transistors via the transmission lines.

5. A broadband amplifier comprising:
a plurality of transistors; and
impedance matching circuits that include parallel capacitors and via holes for connecting first ends of the parallel capacitors to a lower potential electrode, and that are connected to input terminals of the transistors via transmission lines, wherein
the via holes of the impedance matching circuits are used in common with via holes that connect source terminals or emitter terminals of the transistors to a lower potential electrode.

6. The broadband amplifier according to claim 5, wherein the impedance matching circuits are comprised of a multistage configuration including inductors in addition to the parallel capacitors and the via holes.

7. The broadband amplifier according to claim 5, further comprising stabilization circuits that are connected to the input terminals of the transistors via the transmission lines.

8. The broadband amplifier according to claim 5, further comprising short stubs that are connected to the input terminals of the transistors via the transmission lines.

9. A broadband amplifier comprising:
a plurality of transistors;
impedance matching circuits that include first parallel capacitors and first via holes that connect first ends of the first parallel capacitors to a lower potential electrode, and second parallel capacitors and second via holes that connect first ends of the second parallel capacitors to the lower potential electrode, and that are connected to input terminals of the transistors via transmission lines, respectively, wherein
the first via holes of the impedance matching circuits that are connected to any two of the transistors, respectively, are used in common; and
the second via holes of the impedance matching circuits connected to the transistors are used in common with via holes that connect source terminals or emitter terminals of the transistors to the lower potential electrode.

10. The broadband amplifier according to claim 9, wherein
the impedance matching circuits are comprised of a multistage configuration including inductors in addition to the parallel capacitors and the via holes.

11. The broadband amplifier according to claim 9, further comprising stabilization circuits that are connected to the input terminals of the transistors via the transmission lines.

12. The broadband amplifier according to claim 9, further comprising short stubs that are connected to the input terminals of the transistors via the transmission lines.

* * * * *